(12) United States Patent  (10) Patent No.: US 7,741,919 B2
Cowan et al.  (45) Date of Patent: Jun. 22, 2010

(54) ARCHITECTURE FOR MAINTAINING CONSTANT VOLTAGE-CONTROLLED OSCILLATOR GAIN

(75) Inventors: Glenn E. R. Cowan, Montreal (CA); Daniel J. Friedman, Sleepy Hollow, NY (US); Mounir Meghelli, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 12/114,285

(22) Filed: May 2, 2008

(65) Prior Publication Data

US 2009/0273405 A1 Nov. 5, 2009

(51) Int. Cl.
*H03L 7/00* (2006.01)

(52) U.S. Cl. .............................. 331/16; 331/10; 331/12; 331/25; 327/156; 327/157

(58) Field of Classification Search .................. 327/156, 327/157; 331/10, 12, 16, 18, 25; 375/376
See application file for complete search history.

(56) References Cited

U.S. PATENT DOCUMENTS

| | | | |
|---|---|---|---|
| 5,373,257 A * | 12/1994 | Shimoda | 331/8 |
| 5,740,213 A * | 4/1998 | Dreyer | 375/374 |
| 5,870,003 A | 2/1999 | Boerstler | |
| 6,285,263 B1 | 9/2001 | Anderson | |
| 6,320,435 B1 * | 11/2001 | Tanimoto | 327/156 |
| 6,949,984 B2 | 9/2005 | Siniscalchi | |
| 7,019,571 B2 * | 3/2006 | Lim | 327/157 |
| 7,171,318 B2 | 1/2007 | Boerstler et al. | |
| 7,202,718 B2 * | 4/2007 | Lindner et al. | 327/157 |
| 2004/0085105 A1 * | 5/2004 | Mika et al. | 327/157 |
| 2006/0238261 A1 | 10/2006 | Rhee et al. | |
| 2006/0244542 A1 * | 11/2006 | Knoll et al. | 331/16 |
| 2007/0247234 A1 * | 10/2007 | Roper | 331/16 |

* cited by examiner

*Primary Examiner*—Joseph Chang
*Assistant Examiner*—Jeffrey Shin
(74) *Attorney, Agent, or Firm*—Scully, Scott, Murphy & Presser, P.C.; Anne V. Dougherty, Esq.

(57) ABSTRACT

A voltage controlled oscillator and a method of operating a voltage-controlled oscillator are disclosed. The oscillator comprises a current controlled oscillator having a variable frequency current output, a first control path for generating a first control current having a first adjustable gain, and a second control path for generating a second control current having a second adjustable gain. A summer is provided for adding the first and second control currents to obtain a summed control current, and for applying the summed control current as an input current to the current controlled oscillator. A control sub-circuit is used for controlling the gain of the first control current as a function of a defined voltage on the second control path to maintain constant the gain of the current output of the current controlled oscillator over a given operating range of the current controlled oscillator.

20 Claims, 4 Drawing Sheets

SINGLE CONTROL CURRENT

DIFFERENTIAL CONTROL CURRENTS

DIFFERENTIAL CONTROL CURRENTS, EACH THE SUM OF A CURENTS FROM THE PROPORTIONAL INTEGRAL TUNING PATHS

ARCHITECTURE FOR MAINTAINING CONSTANT VOLTAGE-CONTROLLED OSCILLATOR GAIN

BACKGROUND OF THE INVENTION

1. Field of the Invention

The present invention generally relates to voltage-controlled oscillators, and more specifically, the invention relates to architectures for maintaining constant voltage controlled oscillator gain. Even more specifically, the preferred embodiment of the invention relates to such an architecture that is very well suited for use in phase-locked loops in order to make loop dynamics uniform across the tuning range of the voltage controlled oscillator.

2. Background Art

Phase-locked loops (PLLs) are commonly used to generate high-frequency signals in a wide variety of electronic circuit applications. Many important PLL parameters (jitter, settling time) depend on the bandwidth of the PLL. Loop bandwidth in turn depends on, among other parameters, the gain of the oscillator in the PLL. In the case of a voltage-controlled oscillator (VCO), the gain, which is the incremental slope of its output frequency vs. tuning voltage characteristic, has the units Hz/V. For many VCO types (e.g., LC, ring VCOs of the current starved type, ring VCOs of the delay interpolating type, or ring VCOs of a hybrid type), their output frequency vs. tuning voltage characteristic is nonlinear; giving rise to a VCO gain that varies as a function of tuning voltage. For many VCOs, the input voltage is converted to a current (by a voltage to current converter (V-I converter)), which in turn is applied to a circuit and which can be viewed as a current controlled oscillator (ICO). Non-linearity in the overall VCO tuning characteristic can stem from non-linearity in the ICO's output frequency vs. tuning current characteristic, or from non-linearity in the V-I converter's current vs. voltage characteristic. Solutions exist to create a VCO with a linear characteristic by introducing a non-linearity into the V-I converter that compensates for the inherent non-linearity of the ICO.

Single port VCOs do not always enable adequate PLL performance due to tradeoffs associated with VCO gain. High VCO gain helps enable a wide tuning range, while low VCO gain helps reduce noise sensitivity. Architectures have been proposed that split the VCO control path into two (or more) paths. In the case of a two-path control loop, one path has lower gain and high bandwidth, while the other path has high gain and lower bandwidth. This splitting reduces the VCO's noise sensitivity by allowing for substantial filtering on the high VCO gain path, however, the VCO will still have a nonlinear tuning characteristic.

SUMMARY OF THE INVENTION

An object of this invention is to maintain constant the gain of a voltage-controlled oscillator over the tuning range of the oscillator.

Another object of the present invention is to provide a voltage-controlled oscillator with two input control paths, and to control the voltage-to-frequency conversion of these two input paths so that the gain of the oscillator is relatively constant over the tuning range of the oscillator.

These and other objectives are attained with a voltage-controlled oscillator and a method of operating a voltage controlled oscillator. The oscillator comprises a current controlled oscillator having a variable frequency current output, a first control path for generating a first control current having a first adjustable gain, and a second control path for generating a second control current having a second adjustable gain. A summer is provided for adding the first and second control currents to obtain a summed control current, and for applying the summed control current as an input current to the current controlled oscillator. A control sub-circuit is used for controlling the gain of the first control current as a function of a defined voltage on the second control path to maintain constant the gain of the current output of the current controlled oscillator over a given operating range of said current controlled oscillator.

The present invention may be applied to a two path PLL scheme, though it is also applicable to a single charge pump scheme. A preferred PLL, described below in detail, employs two charge pumps, each driving its own loop filter. One charge pump drives a large capacitor and is denoted as the "integral path". The other charge pump drives a resistor in parallel with a small capacitor. This is denoted as the "proportional path". The output of each loop filter connects to a V-I converter. The outputs of the V-I converters are added together and applied to the ICO. In this architecture, the VCO gain through the proportional path ($K_p$) typically defines the PLL bandwidth while the integral path will determine the VCO's tuning range. The integral path can be filtered without degrading loop stability thereby reducing the PLL's noise sensitivity.

During regular operation, the proportional path control voltage is kept small, since the integral path integrates phase errors between the VCO's output and the reference clock out. The small voltage on the proportional path means that non-linearity in the proportional path V-I converter will not be exercised, and it is only the small-signal gain of the V-I converter on the proportional path that will influence PLL dynamics. However, the small signal gain of the ICO to the proportional path is a function of the voltage on the integral path. As the VCO tunes across its frequency range due to changes in the integral path's control voltage, the proportional paths gain changes.

To prevent the proportional path small-signal gain from changing as the VCO is tuned across its operating range by the integral path, the gain of the V-I converter on the proportional path is made to be a function of the voltage on the integral path. Selecting the appropriate function can result in a proportional path VCO gain that is constant across the integral path's tuning range.

In this invention, the proportional path V-I converter is decomposed into two V-I converters. The first V-I converter has fixed gain. The second V-I converter has variable gain proportional to 1-x where x is the output of the integral path V-I converter (normalized to having a range from 0 to 1). The outputs of the two proportional path V-I converters are connected together, meaning that their outputs are summed, and applied to the ICO. The gain of the composite proportional path V-I converter varies in a way that largely compensates for the non-linearity in the ICO's tuning characteristic. This allows for the variation in the VCO's proportional path gain across the integral path's tuning range to be reduced.

Further benefits and advantages of this invention will become apparent from a consideration of the following detailed description, given with reference to the accompanying drawings, which specify and show preferred embodiments of the invention.

DETAILED DESCRIPTION OF THE PREFERRED EMBODIMENTS

The preferred embodiment of the present invention relates to an architecture for maintaining constant the gain of a voltage-controlled oscillator, and the preferred architecture is very well suited for use in phase locked loops (PLLs). As an example, FIG. 1 illustrates a generic PLL relevant to the field of the invention.

Figure 1:
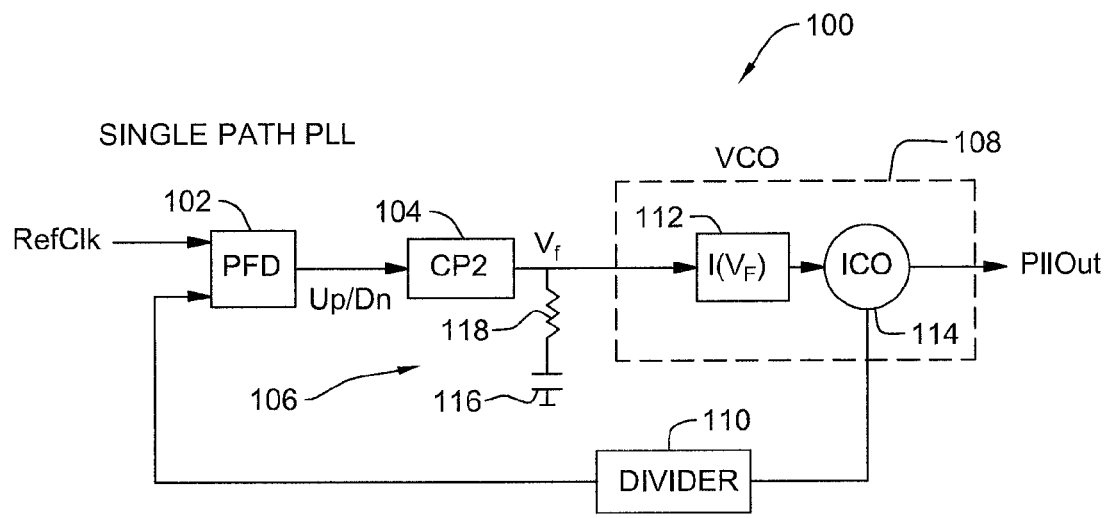
FIG. 1 shows a single path phase-locked loop.

Referring to FIG. 1 of the drawings, the reference numeral 100 generally designates a conventional PLL. A conventional PLL comprises a Phase-Frequency Detector (PFD) 102, a charge pump 104, a Low Pass Filter (LPF) 106, a VCO 108, and a frequency divider 110. The LPF 106 further comprises a capacitor 116 and a resistor 118. Also, the VCO 108 includes a voltage-to-current converter 112 and a current controlled oscillator 114.

The PLL 100 operates by maintaining charge on the first capacitor 116 of the LPF 106. A reference signal or input signal is input into the PFD 102 along with feedback from the frequency divider 110. Based on the comparison between the inputted signals, the PFD 102 can activate switches (not shown) of the charge pump 104 to add charge to or to remove charge from the capacitor 116 of the LPF 106. Also, based on the comparison between the inputted signals, the PFD 102 may not provide an activation signal, which maintains the level of charge on the capacitor 116 of the LPF 106.

The act of adding to or subtracting from the charge stored on the capacitor effectively changes the voltage of the LPF 106 because of the capacitive relationship between charge and voltage. The voltage of the LPF 106 is then input into the VCO 108 and is used to control the frequency and phase of the output of the VCO 108. During steady-state operation (when the PLL is locked), the action of the loop aligns the phase and frequency of the divided feedback signal to the phase and frequency of the reference clock. The output signal from the VCO 108 is input into the frequency divider 110. Also, the output signal of VCO 108 is used in a variety of circuits to perform a variety of tasks.

With conventional PLLs, there are some disadvantages. One disadvantage is non-linearity in the overall VCO voltage-to-frequency tuning characteristic. Non-linearity in said tuning characteristic results in variation in VCO gain. The non-linearity can stem from non-linearity in the ICO's output frequency vs. tuning current characteristic, or from non-linearity in the voltage to current converter's current vs. voltage characteristic.

Figure 2:
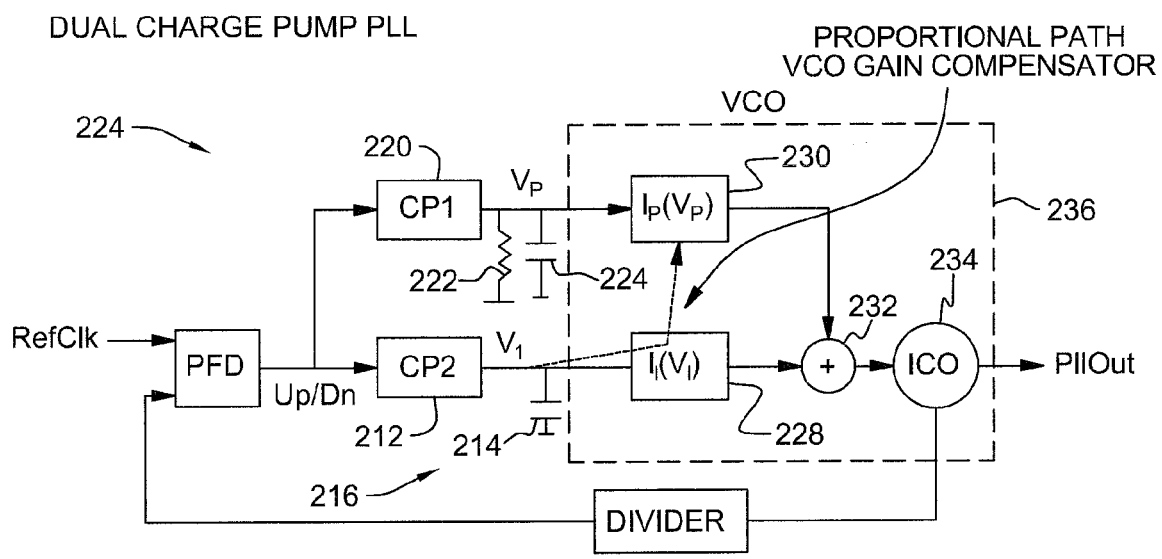
FIG. 2 shows a dual charge pump phase-locked loop.

The present invention addresses this voltage-to-frequency tuning characteristic non-linearity and, more specifically, provides an architecture for maintaining constant the gain of the VCO. FIG. 2 illustrates an embodiment of the present invention. This embodiment employs two charge pumps. It should be noted that the invention is also applicable to single charge pump scheme.

With reference to FIG. 2, one charge pump 212 drives a large capacitor 214 and is denoted as the "integral path" 216. The other charge pump 220 drives a resistor 222 in parallel with a small capacitor 224. This is denoted as the "proportional path" 226. The output of each loop filter connects to a V-I converter 228, 230. The outputs of the V-I converters are added together at 232 and applied to the ICO 234. In this architecture, the VCO 236 gain through the proportional path ($K_P$) typically defines the PLL bandwidth while the integral path will determine the VCO's tuning range. The integral path can be filtered without degrading loop stability thereby reducing the PLL's noise sensitivity.

During regular operation, the proportional path control voltage is kept small, since the integral path integrates phase errors between the VCO's output and the reference clock out. The small voltage on the proportional path means that non-linearity in the V-I converter will not be exercised, and it is only the small-signal gain of the V-I converter on the proportional path that will influence PLL dynamics. However, the small signal gain of the ICO to the proportional path is a function of the total current applied to it. Hence, this gain is dependent on the voltage applied to the integral path V-I converter. As the VCO tunes across its frequency range due to changes in the integral path's control voltage, the proportional paths gain changes.

To prevent the proportional path small-signal gain from changing as the VCO is tuned across its operating range by the integral path, the gain of the V-I converter 230 on the proportional path is made to be a function of the voltage on the integral path. This is indicated in FIG. 2 by the line connecting the proportional path V-I converter 230 to the output of the integral path V-I converter. Selecting the appropriate functional relationship between the two V-I converters can result in a proportional path VCO gain that is constant across the integral path's tuning range.

Thus, in this invention, the proportional path V-I converter is decomposed into two V-I converters. The first V-I converter has fixed gain. The second V-I converter has variable gain proportional to 1-x where x is the output of the integral path V-I converter (normalized to having a range from 0 to 1). The outputs of the two proportional path V-I converters are connected together, meaning that their outputs are summed, and applied to the ICO. This allows for the variation in the VCO's gain across the integral path's tuning range to be reduced.

It should be noted that $K_P$ might be dependent on either $V_i$ or $I_i$. If the integral path V-I converter were perfectly linear, the distinction between $I_i$ and $V_i$ would be moot, as $I_i$ would be a linear function of $V_i$, and applying either to $K_P$ would be equivalent. Since the integral path V-I converter might not be perfectly linear, the connection, in the preferred embodiment of the invention, is made to $I_i$. The link is preferably made through $I_i$ in order to undo the non-linearity in the ICO's tuning curve (due to $I_i$). The ICO only knows about the current $I_i$ applied to it. This approach is negatively affected by non-linearity in $K_i$.

Figure 3A:
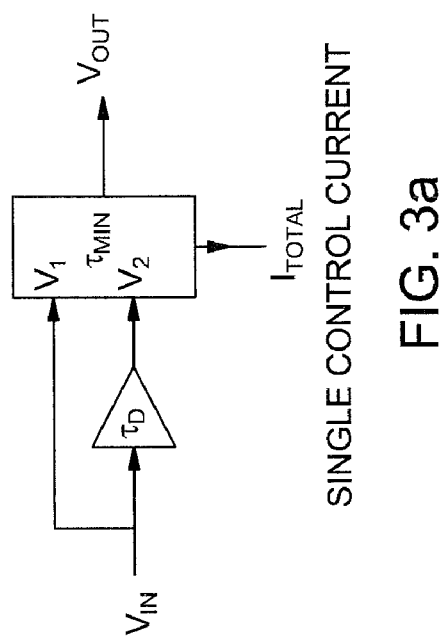
FIGS. 3(a), 3(b) and 3(c) illustrate three signaling schemes for delay interpolators that may be used in the practice of the present invention.
Figure 3B:
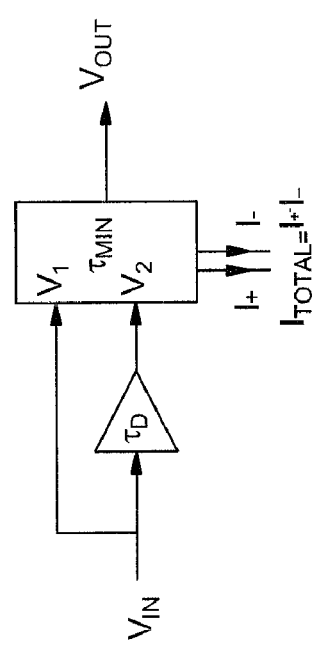

The following analysis applies to the particular case of a delay-interpolating ring VCO. Such a VCO is composed of at least three delay interpolators connected in DC negative feedback. FIG. 3a shows a delay interpolator. The output voltage of the interpolator, $V_{OUT}$, is a weighted average of signals $V_1$ and $V_2$. As $I_{TOTAL}$ tunes from $-I_{MAX}$ to $+I_{MAX}$, the output voltage of the interpolator tunes from $V_1$ to $V_2$ in the following fashion:

$$V_{OUT} = V_1\left(1 - \frac{I_{TOTAL}}{I_{MAX}}\right) + V_2\frac{I_{TOTAL}}{I_{MAX}}$$

This leads to an overall delay from $V_{IN}$ to $V_{OUT}$ given by:

$$\tau_{DI} = \tau_{MIN} + \frac{\tau_D}{2} + \frac{\tau_D}{2}\frac{I_{TOTAL}}{I_{MAX}},$$

Where $\tau_{MIN}$ is the minimum delay of one stage, $\tau_D$ the delay of the extra delay added to the lower path in the interpolator. It is assumed that the input signal, $V_{IN}$, has a rise time longer than $\tau_D$.

The VCO gain on the proportional path is given by:

$$\frac{d f_{VCO}}{dV_P} = \frac{df(I_{Total})}{dI_{Total}}\frac{dI_P}{dV_P}$$

Due to the integration action of the integral path, $V_P$ is usually kept small, limiting our interest to:

$$\frac{d f_{VCO}}{dV_P}\bigg|_{V_P=0} = \frac{df(I_{Total})}{dI_{Total}}G_{m,P},$$

where $G_{m,P}$ is the transconductance of the proportional path V-I converter. Clearly, to maintain a constant VCO gain, $G_{m,P}$ should have the following functional form:

$$G_{m,P} = \left(\frac{df(I_{Total})}{dI_{Total}}\right)^{-1}$$

generally, this will require $G_{m,P}$ to be a function of $I_{Total}$

The following analysis applies to the particular case of a delay-interpolating ring VCO. Such a VCO is composed of at least three delay interpolators connected in DC negative feedback. FIG. 3a shows a delay interpolator. The output voltage of the interpolator, $V_{OUT}$, is a weighted average of signals $V_1$ and $V_2$. As $I_{TOTAL}$ tunes from $-I_{MAX}$ to $+I_{MAX}$, the output voltage of the interpolator tunes from $V_1$ to $V_2$ in the following fashion:

$$V_{OUT} = V_1\left(1 - \frac{I_{TOTAL}}{I_{MAX}}\right) + V_2\frac{I_{TOTAL}}{I_{MAX}}$$

This leads to an overall delay from $V_{IN}$ to $V_{OUT}$ is given by:

$$\tau_{DI} = \tau_{MIN} + \frac{\tau_D}{2} + \frac{\tau_D}{2}\frac{I_{TOTAL}}{I_{MAX}},$$

Where $\tau_{MIN}$ is the minimum delay of one stage, $\tau_D$ is the delay of the extra delay added to the lower path in the interpolator. It is assumed that the input signal, $V_{IN}$, has a rise time longer than $\tau_D$.

Figure 3C:
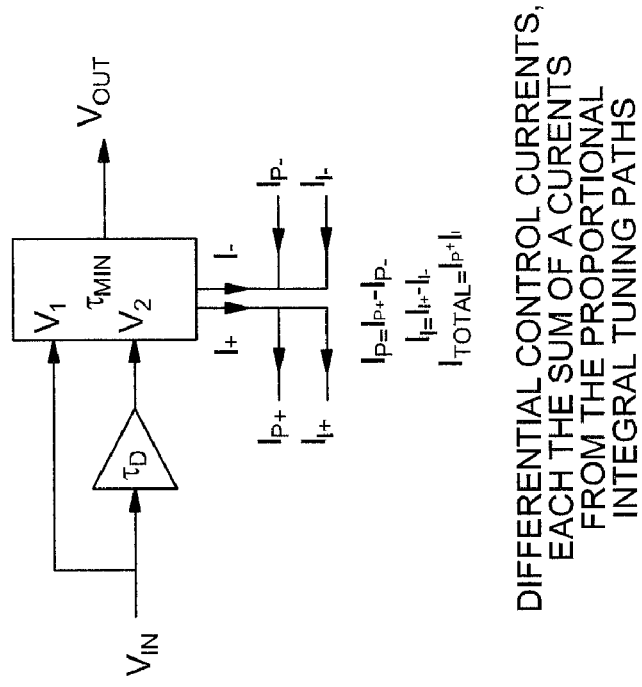

The period of a delay-interpolating ring VCO (composed of interpolators depicted in FIG. 3c) is:

$$\tau_{VCO} = 2N\left(\tau_{MIN} + \frac{\tau_D}{2} + \frac{\tau_D}{2}\left(\frac{I_I(V_I) + I_P(V_P)}{I_{MAX}}\right)\right)$$

where N is the number of stages in the ring,. $I_{MAX}$ is the maximum value of the sum of $I_I$ and $I_P$. $I_I$ and $I_P$ are assumed to be differential quantities. The overall delay of each delay interpolating stage can range between $\tau_{MIN}$ (when the sum of $I_I$ and $I_P$ is $-I_{MAX}$) and $\tau_{MIN}+\tau_D$ (when the sum of $I_I$ and $I_P$ is $+I_{MAX}$). The frequency of oscillation is given by:

$$f_{VCO} = \frac{1}{2N\left(\tau_{MIN} + \frac{\tau_D}{2} + \frac{\tau_D}{2}\left(\frac{I_I(V_I) + I_P(V_P)}{I_{MAX}}\right)\right)}$$

and the gain of the VCO through the proportional path is:

$$\frac{d f_{VCO}}{dI_P} = \frac{-\frac{\tau_D}{2I_{MAX}}}{2N\left(\tau_{MIN} + \frac{\tau_D}{2} + \frac{\tau_D}{2}\left(\frac{I_I(V_I) + I_P(V_P)}{I_{MAX}}\right)\right)^2}$$

To gain more insight into the above expression, assume $\tau_{MIN}$ and $\tau_D$ are equal and consider the behavior for $I_P=0$.

$$\frac{d f_{VCO}}{dI_P}\bigg|_{I_P=0} = \frac{-1}{4I_{MAX}N\tau_D\left(\frac{3}{2} + \frac{1}{2}\left(\frac{I_I}{I_{MAX}}\right)\right)^2}$$

$$= \frac{-1}{K\left(\frac{9}{4} + \frac{3}{2}\left(\frac{I_I}{I_{MAX}}\right) + \frac{1}{4}\left(\frac{I_I}{I_{MAX}}\right)^2\right)}$$

where
$$K = 4I_{MAX}N\tau_D$$

If the PLL is designed so that $I_P$ is limited to be much smaller than $I_I$, the above derivative can vary over a 1 to 4 range as $I_I$ is tuned from $-I_{MAX}$ to $+I_{MAX}$ and so would the VCO gain if the proportional path V-I converter were to have a constant gain. However, the VCO gain can be made constant if (referring to the equation given in paragraph 29):

$$G_{m,P} = \frac{dI_P}{dV_P}\bigg|_{V_P=0} \propto \frac{9}{4} + \frac{3}{2}\left(\frac{I_I}{I_{MAX}}\right) + \frac{1}{4}\left(\frac{I_I}{I_{MAX}}\right)^2$$

Making $G_{m,P}$ have a quadratic relationship with $I_I$ may be impractical. However, an adequate approximation can be achieved by using only a constant and linear dependency, as given below:

$$G_{m,P} \propto \frac{5}{2} + \frac{3}{2}\left(\frac{I_I}{I_{MAX}}\right)$$

Figure 4:
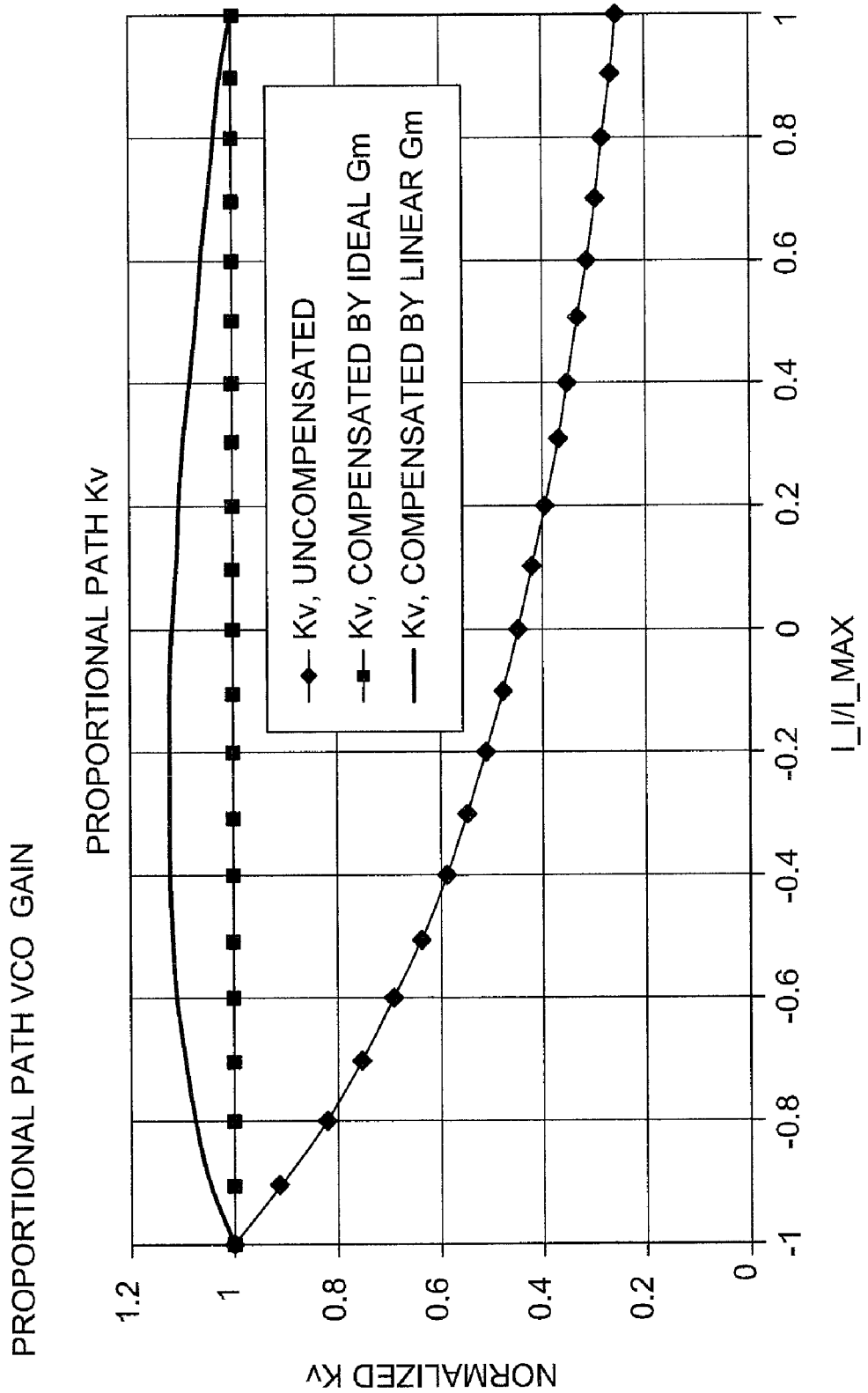
FIG. 4 is a graph showing predicted VCO gain as a delay interpolating VCO is tuned across its integral path.

FIG. 4 shows predicted small-signal proportional path VCO gain as a delay interpolating VCO is tuned across its integral path. Clearly, implementing only a linear scheme significantly reduces across band fluctuations in gain as compared to the uncompensated scheme.

Figure 5:
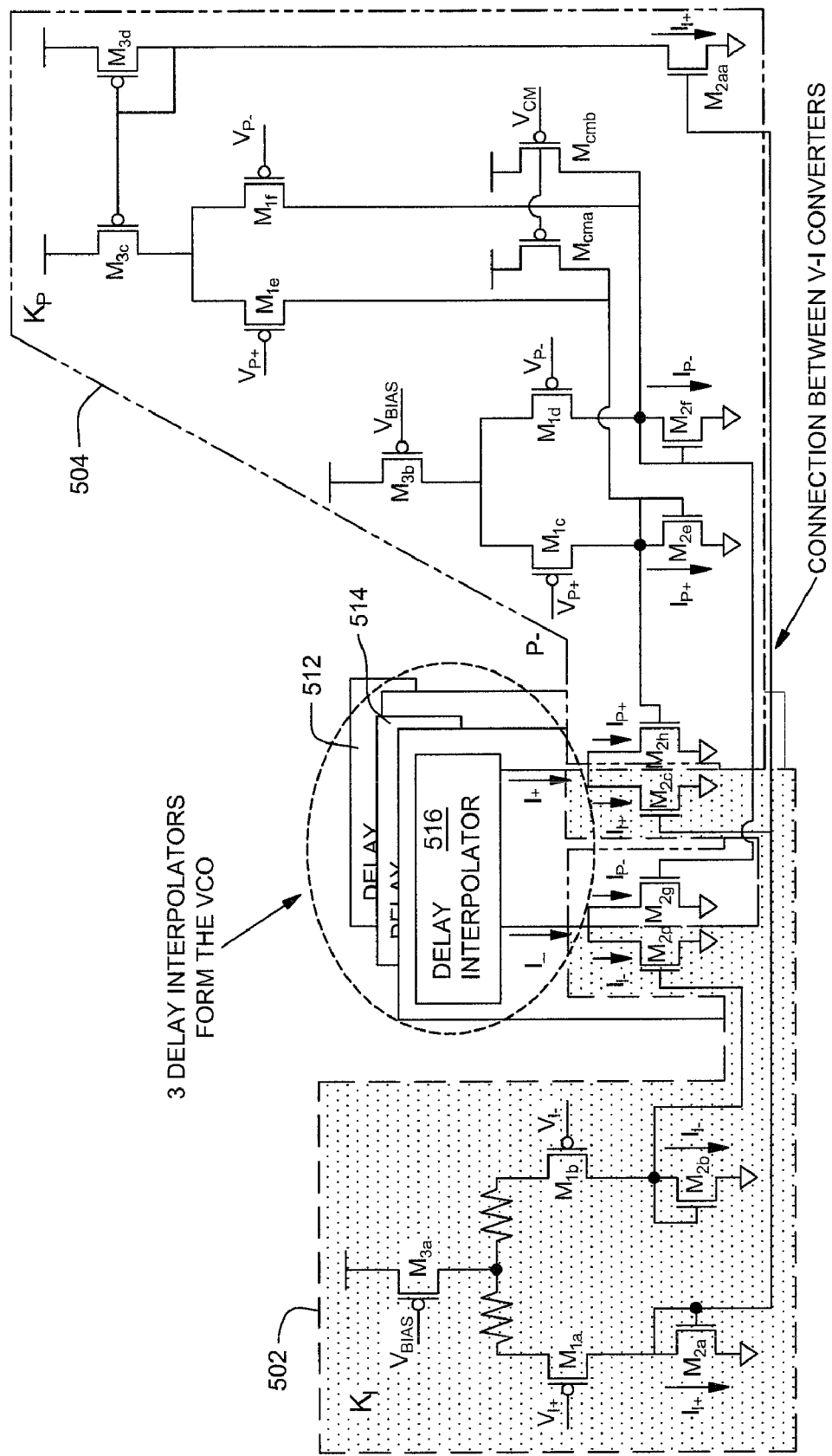
FIG. 5 is a circuit diagram showing an implementation of the present invention.

FIG. 5 shows an implementation of the described linear scheme. The integral path V-I converter 502 is shown on the left (denoted by $K_I$ and enclosed within a dash line) while the proportional path V-I converter 504 is shown on the right (denoted by $K_P$ and enclosed within a dot-dash line). The outputs of these two V-I converters are summed and applied to the delay interpolators 512, 514 and 516. The converter 502 includes a group of transistors $M_{1a}$, $M_{1b}$, $M_{2a}$, $M_{2b}$, $M_{2c}$, $M_{2d}$ and $M_{3a}$. The converter 504 includes a second group of transistors $M_{1c}$, $M_{1d}$, $M_{1e}$, $M_{1f}$, $M_{2e}$, $M_{2f}$, $M_{2g}$, $M_{2h}$, $M_{3b}$, $M_{3c}$, $M_{3d}$, $M_{2aa}$, $M_{cma}$ and $M_{cmb}$.

The proportional path V-I converter is further composed of two V-I converters 520 AND 522. Transistors $M_{1c/d}$ form a constant transconductance while $M_{1f/g}$ form a variable transconductance dependent on the current $I_{I+}$. If $M_{1f/g}$ operate in weak inversion, their transconductance will be proportional with the current $I_{I+}$. Through a common-mode feedback network (not shown) transistors $M_{cma/b}$ ensure that the common-mode current in transistors $M_{2e/f}$ is regulated. Through appropriate sizing of the transistors in the V-I converters, the desired transconductance can be achieved giving rise to significantly reduced fluctuations in the small-signal proportional path VCO gain.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A voltage controlled oscillator comprising:
   a current controlled oscillator having a variable frequency output;
   a first control path for generating a first control current having a first adjustable gain;
   a second control path for generating a second control current having a second adjustable gain;
   a summer for adding the first and second control currents to obtain a summed control current, and for applying the summed control current as an input current to the current controlled oscillator; and
   a control sub-circuit for controlling the gain of the first control path as a function of a defined voltage on the second control path to maintain constant the gain of the output of the current controlled oscillator over a given operating range of said current controlled oscillator; and
   wherein the second control path includes a voltage-to-current converter, said defined voltage is an output voltage of said voltage-to-current converter, and the control sub-circuit applies said output voltage of the voltage-to-current converter to the first control path to control the magnitude of the first control current.

2. The voltage controlled oscillator according to claim 1 wherein:
   the first control path includes:
   i) a proportional path voltage to current converter, and
   ii) a first charge pump for generating a first voltage and for applying said first voltage to the proportional path voltage to current converter to generate the first control current;
   the second control path further includes:
   a second charge pump for generating a second voltage and for applying said second voltage to the voltage to current converter of the second control path to generate the second control current;
   the control sub-circuit applies said defined voltage to the proportional voltage to current converter to control the magnitude of the first control current output by said proportional path voltage to current converter.

3. The voltage controlled oscillator according to claim 2, wherein the proportional path voltage to current converter has transductance, $G_{mP}$, of the form:

$$G_{mP} = \left(\frac{df(I_{TOTAL})}{dI_{TOTAL}}\right)^{-1},$$

where $I_{TOTAL}$ is the total tuning current for the current controlled oscillator, and the frequency of oscillation of the voltage controlled oscillator is $f_{VCO}=f(I_{TOTAL})$.

4. The voltage controlled oscillator according to claim 3, wherein:

$$G_{mP} = \frac{dI_P}{dV_P}\bigg|_{V_P=0}$$

where $I_p$ ($V_p$) is the current generated by the first control path due to the first voltage.

5. The voltage controlled oscillator according to claim 4, wherein:

$$G_{m,P} \propto \frac{5}{2} + \frac{3}{2}\left(\frac{I_I}{I_{max}}\right),$$

where $I_{TOTAL}$ varies between $-I_{MAX}$ to $I_{MAX}$, and $I_I(V_I)$ is the current generated by the integral voltage to current converter due to the second voltage.

6. A voltage controlled oscillator comprising:
   a current controlled oscillator having a variable frequency output;
   a first control path for generating a first control current having a first adjustable gain;
   a second control path for generating a second control current having a second adjustable gain;
   a summer for adding the first and second control currents to obtain a summed control current, and for applying the summed control current as an input current to the current controlled oscillator; and
   a control sub-circuit for controlling the gain of the first control path as a function of a defined voltage on the second control path to maintain constant the gain of the output of the current controlled oscillator over a given operating range of said current controlled oscillator; and
   wherein:
   the first control path includes a first voltage to current converter and a second voltage to current converter;
   said first voltage to current converter has a fixed gain; and
   said second voltage to current converter has a variable gain that varies as a function of said defined voltage on the second control path.

7. The voltage controlled oscillator according to claim 6, wherein said control sub-circuit applies the voltage on the second control path to the first control path to control the gain of the first control path.

8. The voltage-controlled oscillator according to claim 7, wherein the control sub-circuit applies said defined voltage on the second circuit path to said second voltage to current converter.

9. The voltage controlled oscillator according to claim 6, wherein the gain of the second voltage to current converter is proportional to 1-x, where x is a normalized value of the second control circuit.

10. The voltage controlled oscillator according to claim 9, wherein the first control path further includes a summer for adding the current outputs of the first and second voltage to current converters.

11. A method of operating a voltage controlled oscillator comprising the steps of:
generating a first control current in a first control path, said first control path having a first adjustable gain;
generating a second control current in a second control path, said second control path having a second adjustable gain;
adding the first and second control currents to obtain a summed control current, and applying the summed control current as an input current to a current controlled oscillator, the current controlled oscillator having a variable frequency current output; and
controlling the gain of the fist control current as a function of a defined voltage on the second control path to maintain constant the gain of the voltage controlled oscillator over a given operating range of said voltage controlled oscillator; and
wherein the second control path includes a voltage-to-current converter, said defined voltage is an output voltage of said voltage-to-current converter, and the controlling step includes the step of applying said output voltage of the voltage-to-current converter to the first control path to control the magnitude of the first control current.

12. The method according to claim 11, wherein:
the first control path includes a first voltage to current converter and a second voltage to current converter;
said first voltage to current converter has a fixed gain;
said second voltage to current converter has a variable gain; and
the controlling step includes the step of varying the variable gain of the second voltage to current converter as a function of said defined voltage on the second control path.

13. The method according to claim 12, wherein said varying step includes the step of applying the defined voltage on the second control path to the first control path to control the gain of the first control path.

14. The method according to claim 13, wherein the applying step includes the step of applying said defined voltage on the second circuit path to said second voltage to current converter.

15. The method according to claim 12, wherein the gain of the second voltage to current converter is proportional to 1-x, where x is a normalized value of the second control circuit.

16. The method according to claim 15, wherein the first control path further includes a summer for adding the current outputs of the first and second voltage to current converters.

17. The method according to claim 11, wherein:
the first control path includes:
i) a proportional path voltage to current converter, and
ii) a first charge pump for generating a first voltage and for applying said first voltage to the proportional path voltage to current converter to generate the first control current;
the second control path further includes:
a second charge pump for generating a second voltage and for applying said second voltage to the integral path voltage to current converter of the second control path to generate the second control current; and
the applying step includes the step of applying said defined voltage to the proportional path voltage to current converter to control the magnitude of the first control current output by said proportional voltage to current converter.

18. The method according to claim 17, wherein the proportional voltage to current converter has transductance, $G_{mP}$, of the form:

$$G_{mP} = \left(\frac{df(I_{TOTAL})}{dI_{TOTAL}}\right)^{-1},$$

where $I_{TOTAL}$ is the total tuning current for the current controlled oscillator, and the frequency of oscillation of the voltage controlled oscillator is $f_{VCO}=f(I_{TOTAL})$.

19. The method according to claim 18, wherein:

$$G_{mP} = \frac{dI_P}{dV_P}\bigg|_{V_P=0}$$

where $I_p(V_p)$ is the current generated by the first control path due to the first voltage.

20. The method according to claim 19, wherein:

$$G_{m,P} \propto \frac{5}{2} + \frac{3}{2}\left(\frac{I_I}{I_{max}}\right),$$

where $I_{TOTAL}$ varies between $-I_{MAX}$ to $I_{MAX}$, and $I_I(V_I)$ is the current generated by the integral path voltage to current converter due to the second voltage.

* * * * *